US007009286B1

(12) United States Patent

Kirloskar et al.

(10) Patent No.: US 7,009,286 B1

(45) Date of Patent: Mar. 7, 2006

(54) THIN LEADLESS PLASTIC CHIP CARRIER

(75) Inventors: Mohan Kirloskar, Cupertino, CA (US); Chun Ho Fan, Hong Kong (HK); Kwok Cheung Tsang, Hong Kong (HK); Kin Pui Kwan, Hong Kong (HK)

(73) Assignee: ASAT Ltd., New Territories (HK)

( * ) Notice: Subject to any disclaimer, the term of this patent is extended or adjusted under 35 U.S.C. 154(b) by 65 days.

(21) Appl. No.: 10/757,508

(22) Filed: Jan. 15, 2004

(51) Int. Cl.
*H01L 23/06* (2006.01)

(52) U.S. Cl. ...................... 257/684; 257/692; 257/693; 257/784; 257/773

(58) Field of Classification Search ................ 257/684, 257/692–693, 784, 773
See application file for complete search history.

(56) References Cited

U.S. PATENT DOCUMENTS

| | | | | |
|---|---|---|---|---|
| 4,530,152 | A | 7/1985 | Roche et al. | 29/588 |
| 4,685,998 | A | 8/1987 | Quinn et al. | 156/633 |
| 5,066,831 | A | 11/1991 | Spielerger et al. | 361/412 |
| 5,293,072 | A | 3/1994 | Tsuji et al. | 257/737 |
| 5,444,301 | A | 8/1995 | Song et al. | 257/737 |
| 5,457,340 | A | 10/1995 | Templeton, Jr. et al. | 257/666 |
| 5,710,695 | A | 1/1998 | Manteghi | 361/813 |
| 5,777,382 | A | 7/1998 | Abbott et al. | 257/695 |
| 5,976,912 | A | 11/1999 | Fukutomi et al. | 438/110 |
| 6,001,671 | A | 12/1999 | Fjelstad | 438/112 |
| 6,057,601 | A | 5/2000 | Lau et al. | 257/730 |
| 6,191,494 | B1 * | 2/2001 | Ooyama et al. | 257/796 |
| 6,194,786 | B1 | 2/2001 | Orcutt | 257/730 |
| 6,229,200 | B1 | 5/2001 | Mclellan et al. | 257/666 |
| 6,294,830 | B1 | 9/2001 | Fjelstad | 257/724 |
| 6,376,921 | B1 * | 4/2002 | Yoneda et al. | 257/787 |
| 6,423,643 | B1 * | 7/2002 | Furuhata et al. | 438/694 |
| 6,441,502 | B1 * | 8/2002 | Yamada et al. | 257/786 |
| 6,459,163 | B1 | 10/2002 | Bai | 257/787 |
| 6,498,099 | B1 | 12/2002 | McLellan et al. | 438/689 |
| 6,585,905 | B1 | 7/2003 | Fan et al. | 216/14 |
| 6,635,957 | B1 | 10/2003 | Kwan et al. | 257/691 |
| 6,661,083 | B1 * | 12/2003 | Lee et al. | 257/676 |
| 6,667,073 | B1 * | 12/2003 | Lau et al. | 427/96.2 |
| 6,781,223 | B1 * | 8/2004 | Mihara et al. | 257/684 |
| 6,864,423 | B1 * | 3/2005 | Tan et al. | 174/52.2 |
| 6,894,382 | B1 * | 5/2005 | Awad et al. | 257/697 |

FOREIGN PATENT DOCUMENTS

| | | |
|---|---|---|
| JP | 59-208756 | 11/1984 |

* cited by examiner

*Primary Examiner*—Luan Thai
(74) *Attorney, Agent, or Firm*—Keating & Bennett, LLP

(57) ABSTRACT

A leadless plastic chip carrier is fabricated by selectively etching a leadframe strip to reduce a thickness of the strip at a portion thereof. Selectively masking the surface of the leadframe strip using a mask, follows selectively etching, to provide exposed areas of the surface at the portion and contact pad areas on leadframe the strip. At least one layer of metal is deposited on the exposed areas to define a die attach pad on the portion of the leadframe strip with reduced thickness and to define contact pads on the surface of the strip. At least one semiconductor die is mounted to the die attach pad, followed by wire bonding the at least one semiconductor die to ones of the contact pads. The at least one semiconductor die, the wire bonds, and the contact pads are covered with an overmold material and the leadframe strip is etched to thereby remove the leadframe strip. The leadless plastic chip carrier is singulated from the leadframe strip.

11 Claims, 7 Drawing Sheets

THIN LEADLESS PLASTIC CHIP CARRIER

FIELD OF THE INVENTION

The present invention relates in general to integrated circuit packaging, and more particularly to a process for fabricating a leadless plastic chip carrier with a unique, low profile die attach pad.

BACKGROUND OF THE INVENTION

According to well known prior art IC (integrated circuit) packaging methodologies, semiconductor dice are singulated and mounted using epoxy or other conventional means onto respective die attach pads (attach paddles) of a leadframe strip. Traditional QFP (Quad Flat Pack) packages incorporate inner leads which function as lands for wire bonding the semiconductor die bond pads. These inner leads typically require mold locking features to ensure proper positioning of the leadframe strip during subsequent molding to encapsulate the package. The inner leads terminate in outer leads that are bent down to contact a mother board, thereby limiting the packaging density of such prior art devices.

In order to overcome these and other disadvantages of the prior art, the Applicants previously developed a Leadless Plastic Chip Carrier (LPCC). According to Applicants' LPCC methodology, a leadframe strip is provided for supporting several hundred devices. Singulated IC dice are placed on the strip die attach pads using conventional die mount and epoxy techniques. After curing of the epoxy, the dice are wire bonded to the peripheral internal leads by gold (Au), copper (Cu), aluminum (Al) or doped aluminum wire bonding. The leadframe strip is then molded in plastic or resin using a modified mold wherein the bottom cavity is a flat plate. In the resulting molded package, the die pad and leadframe inner leads are exposed. By exposing the bottom of the die attach pad, mold delamination at the bottom of the die pad is eliminated, thereby increasing the moisture sensitivity performance. Also, thermal performance of the IC package is improved by providing a direct thermal path from the exposed die attach pad to the motherboard. By exposing the leadframe inner leads, the requirement for mold locking features is eliminated and no external lead standoff is necessary, thereby increasing device density and reducing package thickness over prior art methodologies. The exposed inner leadframe leads function as solder pads for motherboard assembly such that less gold wire bonding is required as compared to prior art methodologies, thereby improving electrical performance in terms of board level parasitics and enhancing package design flexibility over prior art packages (i.e. custom trim tools and form tools are not required). These and several other advantages of Applicants' own prior art LPCC process are discussed in Applicants' U.S. Pat. No. 6,229,200, the contents of which are incorporated herein by reference.

According to Applicants' U.S. Pat. No. 6,498,099, the contents of which are incorporated herein by reference, an etch back process is provided for the improved manufacture of the LPCC IC package. In Applicant's co-pending U.S. application Ser. No. 09/802,678, Entitled Leadless Plastic Chip Carrier With Etch Back Pad Singulation, filed Mar. 9, 2001, the contents of which are incorporated herein by reference, the etch-back LPCC process of Applicants' U.S. Pat. No. 6,498,099 is modified to provide additional design features. The leadframe strip is selectively covered with a thin layer photo-resist mask in predetermined areas. Following the application of the mask, an etch-barrier is deposited as the first layer of the contact pads and die attach pad, followed by several layers of metals which can include for example, Ni, Cu, Ni, Au, and Ag. This method of formation of the contact pads allows plating of the pads in a columnar shape and into a "mushroom cap" or rivet-shape as it flows over the photoresist mask. The shaped contact pads are thereby locked in the mold body, providing superior board mount reliability. Similarly, the die attach pad can be formed in an interlocking shape for improved alignment with the die. The photo-resist mask is then rinsed away and the semiconductor die is mounted to the die attach pad. This is followed by gold wire bonding between the semiconductor die and the peripheral contact pads and then molding as described in Applicant's U.S. Pat. No. 6,229,200. The leadframe is then subjected to full immersion in an alkaline etchant that exposes a lower surface of an array of the contact pads, a power ring and the die attach pad, followed by singulation of the individual unit from the full leadframe array strip. This process includes the deposition or plating of a plurality of layers of metal to form a robust three-dimensional construction of contact pads and the die attach pad.

Still further improvements in high performance integrated circuit (IC) packages are driven by industry demands for increased thermal and electrical performance, decreased size and cost of manufacture.

For particular applications, multiple semiconductor die packages are used. This requires additional space and large molds to accommodate increased package size due to stacking of semiconductor dice. Demand exists for reduced profile IC packages.

SUMMARY OF THE INVENTION

In one aspect of the present invention, a leadless plastic chip carrier is fabricated by selectively etching a leadframe strip to reduce a thickness of the strip at a portion thereof. Selectively masking the surface of the leadframe strip using a mask, follows selectively etching, to provide exposed areas of the surface at the portion and contact pad areas on leadframe the strip. At least one layer of metal is deposited on the exposed areas to define a die attach pad on the portion of the leadframe strip with reduced thickness and to define contact pads on the surface of the strip. At least one semiconductor die is mounted to the die attach pad, followed by wire bonding the at least one semiconductor die to ones of the contact pads. The at least one semiconductor die, the wire bonds, and the contact pads are covered with an overmold material and the leadframe strip is etched to thereby remove the leadframe strip. The leadless plastic chip carrier is singulated from the leadframe strip.

In another aspect, a process for fabricating a leadless plastic chip carrier includes selectively etching a leadframe strip to reduce a thickness of the strip at a portion thereof, selectively masking the surface of the leadframe strip using a mask to provide exposed areas of the surface at the portion and contact pad areas on the strip, depositing a plurality of layers of metal on the exposed areas to define a die attach pad on the portion of the strip with reduced thickness and to define contact pads on the surface of the strip, masking the die attach pad after depositing the at least one layer, depositing at least one further layer of metal on the at least one layer of metal at the contact pads thereby further defining the contact pads, stripping the mask from the die attach pad and the mask from the surface of the leadframe strip, mounting at least one semiconductor die to the die attach pad, wire bonding the at least one semiconductor die to ones of the contact pads, covering the at least one semiconductor die, the wire bonds, and the contact pads with an overmold material, etching the leadframe strip to thereby remove the leadframe strip, and singulating the leadless plastic chip carrier from the leadframe strip.

In yet another aspect, a leadless plastic chip carrier is provided. The leadless plastic chip carrier includes a die attach pad, at least one semiconductor die mounted on the die attach pad, a plurality of contact pads circumscribing the die attach pad, a plurality of wire bonds connecting the at least one semiconductor die and various ones of the contact pads, and an overmold covering the semiconductor die and the contact pads, wherein the die attach pad is offset from the contact pads such that the die attach pad protrudes from the molding compound.

Advantageously, a thin package profile is possible as the die attach pad is offset from the contact pads and protrudes from the molding compound. Because the die attach pad is offset from the contact pads, the semiconductor die sits in a pocket on the die attach pad. Thus, the length of the wire bonds to the contact pads, to the power ring and to the die attach pad (ground) is reduced. This results in lower electrical impedance and permits operation of the package at higher frequencies.

Also, because the die attach pad is offset and protrudes from the molding compound, more space is provided within the package to accommodate several semiconductor dice stacked on top of each other, without significantly increasing the package size over standard, single semiconductor die packages.

BRIEF DESCRIPTION OF THE DRAWINGS

The invention will be better understood with reference to the drawings and the following description in which like numerals denote like parts, and in which.

DETAILED DESCRIPTION OF EMBODIMENTS

Figure 1A:
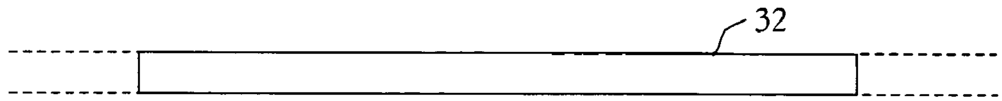
FIGS. 1A to 1L show processing steps for manufacturing a Leadless Plastic Chip Carrier (LPCC) according to one embodiment of the present invention.
Figure 1B:
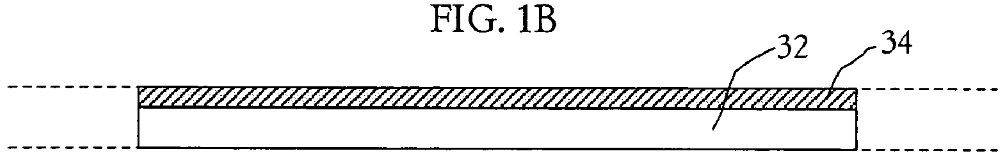
Figure 1C:
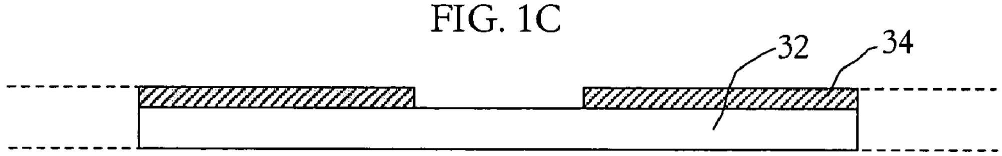
Figure 1D:
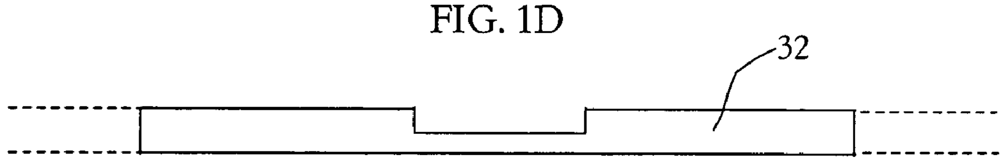
Figure 1E:
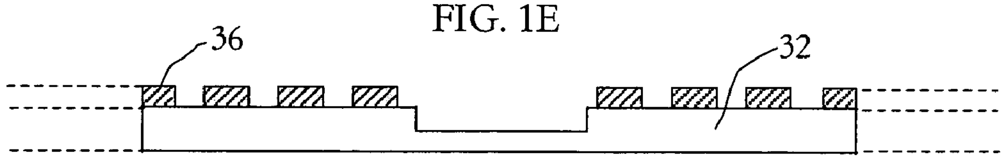
Figure 1F:
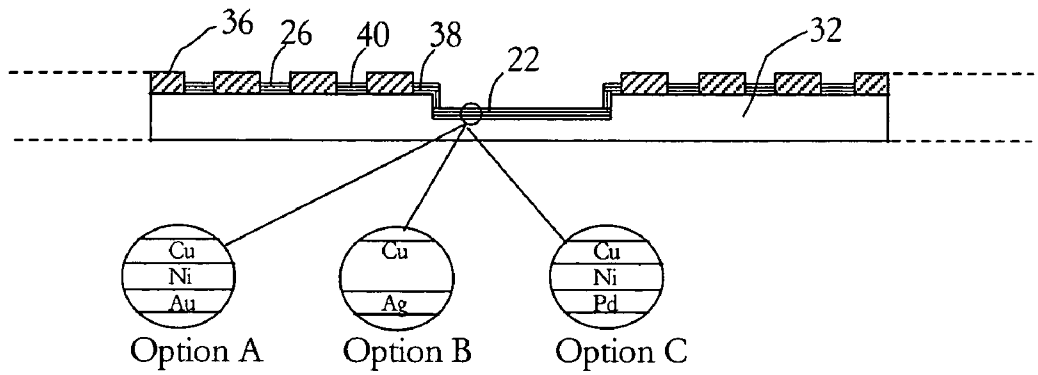
Figure 1G:
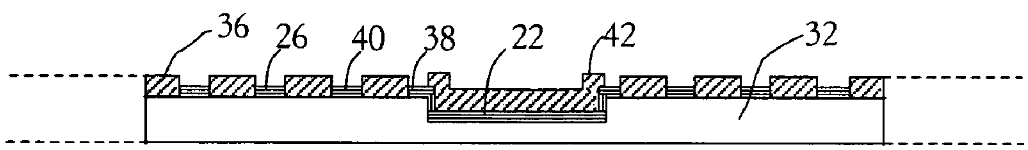
Figure 1H:
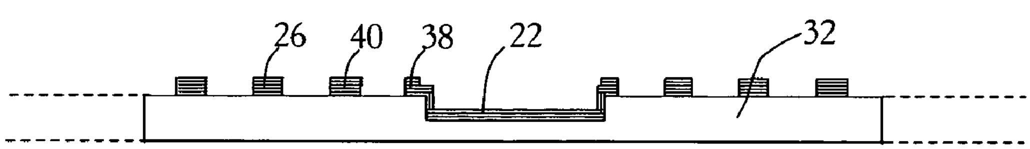
Figure 1I:
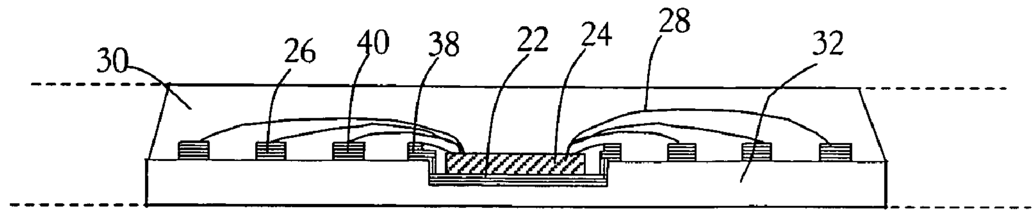
Figure 1J:
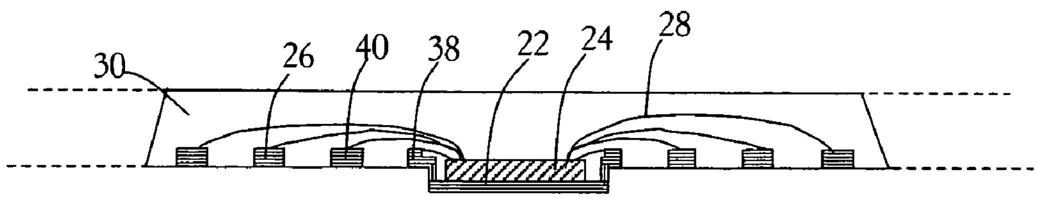
Figure 1K:
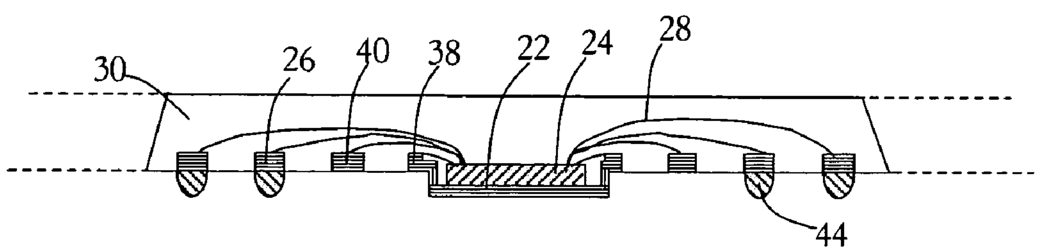
Figure 1L:
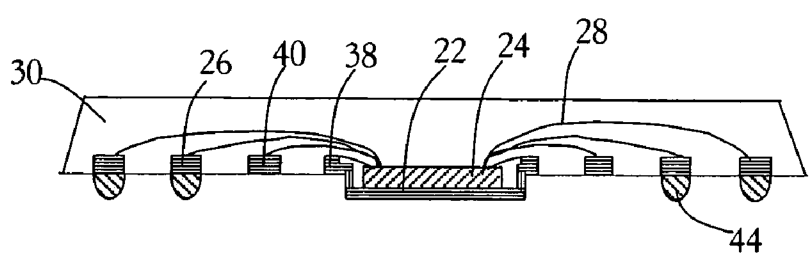

Reference is first made to FIG. 1L, to describe a Leadless Plastic Chip Carrier (LPCC) indicated generally by the numeral 20. The leadless plastic chip carrier 20 includes a die attach pad 22 and a semiconductor die 24 mounted on the die attach pad 22. A plurality of contact pads 26 circumscribe the die attach pad 22 and a plurality of wire bonds 28 connect the semiconductor die 24 and various ones of the contact pads 26. An overmold 30 covers the semiconductor die 24 and the contact pads 26, wherein the die attach pad 22 is offset from the contact pads 26 such that the die attach pad 22 protrudes from the molding compound 30.

A process for fabricating the LPCC 20 will now be better described with reference to FIGS. 1A to 1L, which show processing steps for fabricating the LPCC 20 according to an embodiment of the present invention. Referring to FIG. 1A, an elevation view is provided of a Cu (copper) panel substrate which forms the raw material of the leadframe strip 32. As discussed in greater detail in Applicant's U.S. Pat. No. 6,229,200, issued May 8, 2001, the leadframe strip 32 is divided into a plurality of sections, each of which incorporates a plurality of leadframe units in an array (e.g. 3×3 array, 5×5 array, etc.). Only one such unit is depicted in the elevation view of FIG. 1A, portions of adjacent units being represented by stippled lines. For the purpose of simplicity, the following description generally refers to a single unit of the leadframe strip 32. It will be understood, however, that the present description is not limited to a single unit, but relates to the plurality of leadframe units in the array.

Referring to FIG. 1B, an upper surface of the leadframe strip 32 is coated with a layer of photo-imageable mask 34, such as a photo-imageable epoxy.

Next, the layer of photo-imageable etch-resist mask 34 is imaged with a photo-tool. This is accomplished by exposure of the photo-imageable mask 34 to ultraviolet light masked by the photo-tool and subsequent developing of the solder-mask to result in the configuration shown in FIG. 1C. The photo-imageable mask 34 is thereby patterned to provide a pit in which the upper surface of the Cu substrate (leadframe strip 32) is exposed. Thus, the leadframe strip 32 is selectively masked with the photo-imageable mask 34.

The leadframe strip 32 is then etched on a top surface thereof and, following etching, the photo-imageable mask 34 is stripped away using conventional means. The resulting leadframe strip 32 includes a portion with reduced thickness where the leadframe strip 32 is selectively etched (FIG. 1D).

Next, a plating mask 36 is added to the upper surface of the leadframe strip 32 (FIG. 1E). As will be appreciated, the plating mask 36 is a photo-imageable plating mask 36 and is applied to the entire top surface of the leadframe strip 32. The photo-imageable plating mask 36 is then imaged with a photo-tool by exposure to ultraviolet light masked by the photo-tool. The photo-imageable plating mask is then developed to provide the pattern with exposed areas of the leadframe strip, as shown in FIG. 1E.

As shown in FIG. 1F, layers of metals are deposited on the upper surface of the exposed leadframe strip 32 to form the die attach pad 22 and portions of a ground ring 38, a power ring 40 and the contact pads 26. Different deposition options are provided.

According to option A, an etch barrier of Au (gold of, for example, 20 microinches) is provided over the Cu substrate, followed by a layer of Ni (nickel of, for example, 40 microinches), and then a layer of Cu (for example, 3–4 mils). According to option B, an etch barrier of Ag (silver) is followed by a layer of Cu. According to option C, an etch barrier of Pd (palladium) is followed by a layer of Ni and then Cu.

Referring now to FIG. 1G, a second plating mask 42 is added to cover the die attach pad 22. As with the first plating mask 36, the second plating mask 42 is a photo-imageable plating mask 42 and is selectively applied to the die attach pad by adding the second plating mask 42, imaging with a photo-tool and developing to provide the mask shown in FIG. 1G. Thus, the die attach pad 22 is masked from further metal plating.

After the second plating mask 42 is added, final layers of metal are deposited on the portions of the a ground ring 38, a power ring 40 and the contact pads 26. Different deposition options are provided, depending on the deposition option chosen in FIG. 1F. A layer of Ni and a layer of Au are applied to the metal layers of option A. A layer of Ag is applied to the metal layers of option B. A layer of Ni and a layer of Pd are applied to the metal layers of option C. The final layers thereby complete the ground ring 38, power ring 40 and contact pads 26. After deposition of the final layers, the plating masks 36, 42 are stripped away, resulting in the configuration shown in FIG. 1H.

Referring now to FIG. 1I, the singulated semiconductor die 24 is conventionally mounted via epoxy, to the die attach pad 22 and the epoxy is cured. Other suitable mounting techniques are possible. Gold wires are then bonded between the semiconductor die 24 and the ground ring 38, between the semiconductor die 24 and the power ring 40, and between the semiconductor die 24 and ones of the contact pads 26. The leadframe strip 32 is then molded in a modified mold with a bottom cavity being a flat plate, and subsequently cured, as discussed in Applicants' issued U.S. Pat. No. 6,229,200.

The leadframe 32 is then subjected to a final alkaline etch that fully etches away the copper leadframe 32 and exposes the die attach pad 22, the ground ring 38, the power ring 40 and the contact pads 26 (FIG. 1J). Clearly the ground ring 38 is continuous with the die attach pad 22. As shown in FIG. 1J, the plane that the die attach pad 22 lies on, is offset (vertically in the Figure) from the plane that the power ring 40 and contact pads 26 lie on. Thus, the die attach pad 22 protrudes from a remainder of the components.

Next, a plurality of solder balls 44, commonly referred to as solder bumps, are placed on the exposed surfaces of the contact pads 26. The solder balls 44 are placed using known pick and place and reflow techniques (FIG. 1K).

Figure 2:
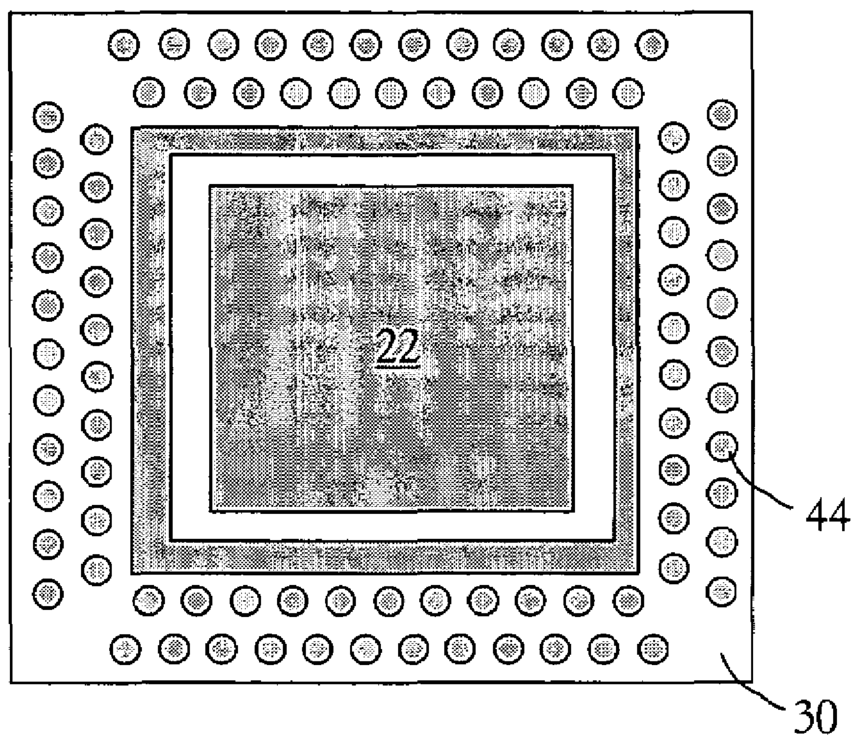
FIG. 2 is a bottom view of the LPCC manufactured according to the processing steps of FIGS. 1A to 1L.

Singulation of the individual LPCC 20 is then performed either by saw singulation or by die punching, resulting in the package shown in FIG. 1L. A bottom view of the package of FIG. 1L is shown in FIG. 2.

Referring now to FIGS. 3A to 3L, processing steps for fabricating a LPCC according to another embodiment of the present invention, are shown. The processing steps shown in FIGS. 3A to 3H are similar to the processing steps described above with reference to FIGS. 1A to 1H and therefore need not be further described herein.

Figure 3A:
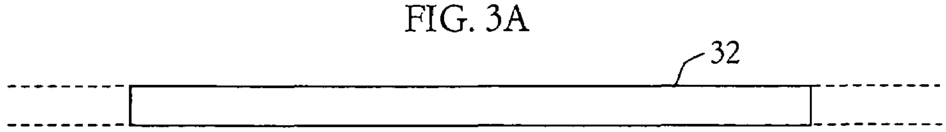
FIGS. 3A to 3L show processing steps for manufacturing a Leadless Plastic Chip Carrier according to another embodiment of the present invention.
Figure 3B:
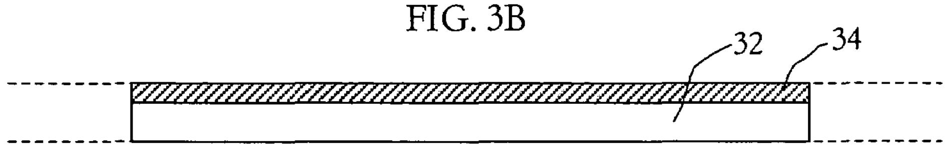
Figure 3C:
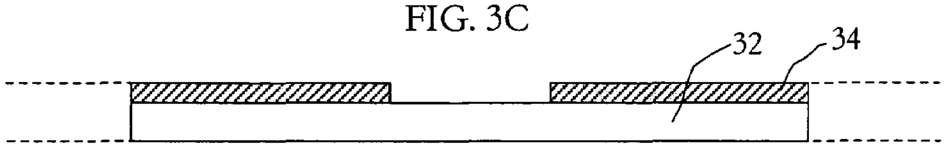
Figure 3D:
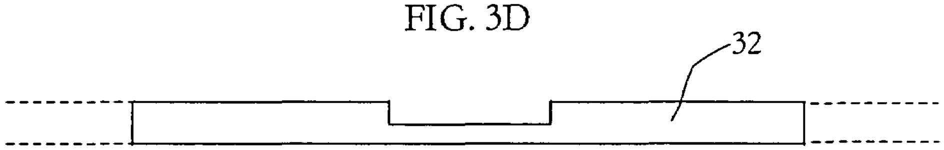
Figure 3E:
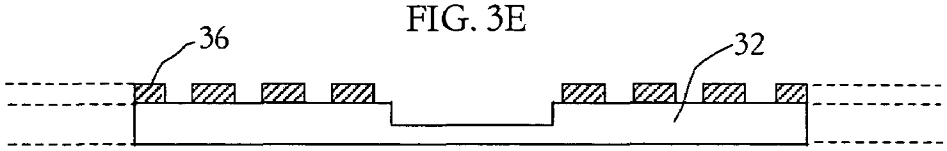
Figure 3F:
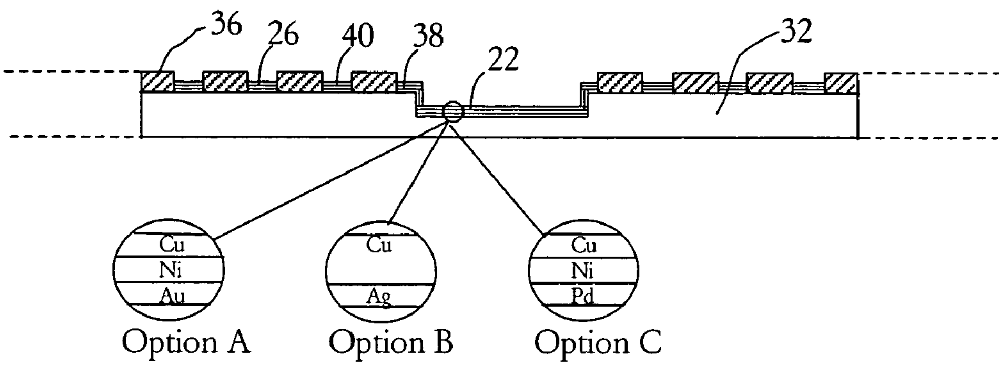
Figure 3G:
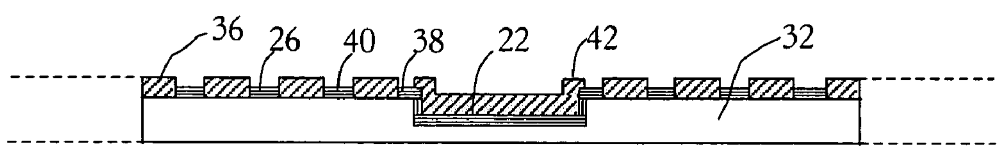
Figure 3H:
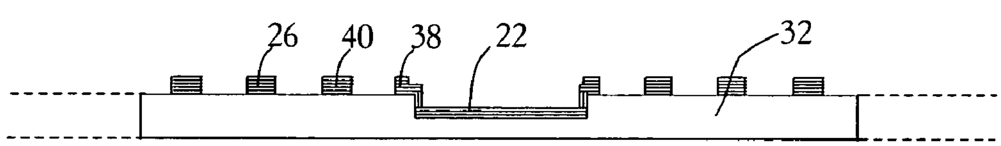
Figure 3I:
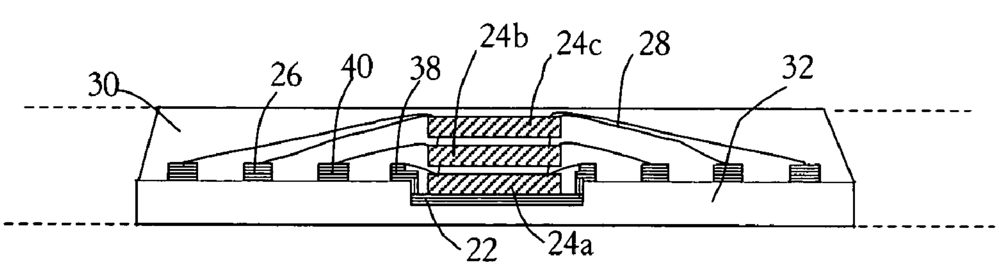

In FIG. 3I, however, rather than mounting a single semiconductor die 24, as shown in FIG. 1I and described above, a plurality of semiconductor dice 24*a*, 24*b*, 24*c* are mounted in a stacked arrangement, one on top of the other. To mount the semiconductor dice 24*a*, 24*b*, 24*c*, the first semiconductor die 24*a* is conventionally mounted via epoxy to the die attach pad 22. Next, gold wires are bonded between the semiconductor die 24*a* and ones of the ground ring 38, the power ring 40 and the contact pads 26. The second semiconductor die 24*b* is then mounted via epoxy to the first semiconductor die 24*a*. Next, gold wires are bonded between the semiconductor die 24*b* and ones of the ground ring 38, the power ring 40 and the contact pads 26. Finally, the third semiconductor die 24*c* is mounted via epoxy to the second semiconductor die 24*b* and gold wires are bonded between the semiconductor die 24*c* and ones of the ground ring 38, the power ring 40 and the contact pads 26. Thus, the semiconductor dice 24*a*, 24*b* are separated by a layer of epoxy. Similarly, the semiconductor dice 24*b*, 24*c* are separated by a layer of epoxy.

The leadframe strip 32 is then molded in a modified mold with a bottom cavity being a flat plate, and subsequently cured, as discussed above.

Figure 3J:
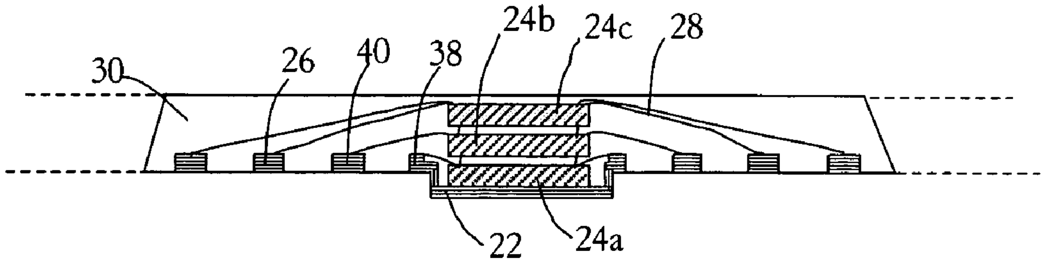
Figure 3K:
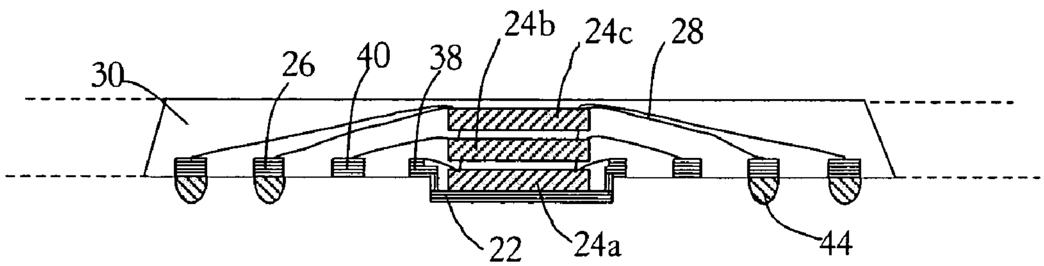
Figure 3L:
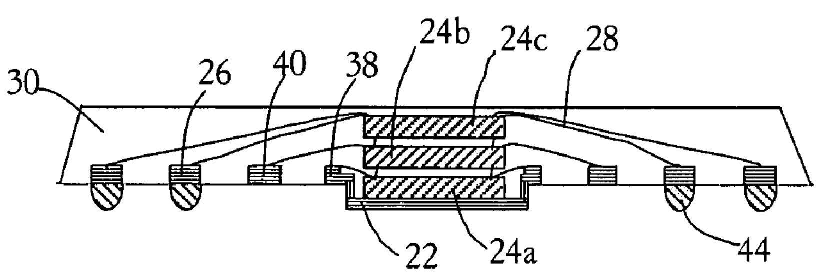

FIGS. 3J to 3L are similar to FIGS. 1J to 1L and therefore are not further described herein.

Specific embodiments of the present invention have been shown and described herein. However, modifications and variations may occur to those skilled in the art. For example, rather than wire bonding between mounting of semiconductor dice 24*a*, 24*b* and 24*c*, the semiconductor dice 24*a*, 24*b* and 24*c* can be mounted in a stack followed by subsequent wire bonding in the case that the semiconductor die 24*a* is larger than the semiconductor dice 24*b* and 24*c* and the semiconductor die 24*b* is larger than the semiconductor die 24*c*. Other modifications and variations are possible. All such modifications and variations are believed to be within the sphere and scope of the present invention.

What is claimed is:

1. A leadless plastic chip carrier comprising:

a die attach pad;

at least one semiconductor die mounted on said die attach pad;

a plurality of contact pads circumscribing and offset from said die attach pad;

a plurality of wire bonds connecting said at least one semiconductor die and various ones of said contact pads; and an overmold covering said semiconductor die and all except one surface of each of said contact pads such that said overmold substantially lies in a plane from which said die attach pad protrudes and from which said contact pads do not protrude.

2. The leadless plastic chip carrier according to claim 1, further comprising a plurality of solder balls disposed on said contact pads.

3. The leadless plastic chip carrier according to claim 1, further comprising a ground ring on a periphery of said die attach pad, said plurality of wire bonds further comprising wire bonds connecting said semiconductor die and said ground ring.

4. The leadless plastic chip carrier according to claim 1, further comprising a power ring intermediate said contact pads and said die attach pad, said plurality of wire bonds further comprising wire bonds connecting said semiconductor die and said power ring.

5. The leadless plastic chip carrier according to claim 1, wherein said at least one semiconductor die comprises a plurality of semiconductor dice stacked on top of each other and said plurality of wire bonds comprises wire bonds connecting ones of said plurality of semiconductor dice and ones of said contact pads.

6. The leadless plastic chip carrier according to claim 5, wherein adjacent ones of said semiconductor dice are separated by a layer of epoxy.

7. The leadless plastic chip carrier according to claim 1, further comprising a plurality of solder balls disposed on said contact pads.

8. The leadless plastic chip carrier according to claim 1, wherein said die attach pad comprises a plurality of layers of metal.

9. The leadless plastic chip carrier according to claim 1, wherein said contact pads comprise a plurality of layers of metal.

10. The leadless plastic chip carrier according to claim 8, wherein said plurality of layers of metal includes layers of gold, nickel and copper, or silver and copper, or palladium, nickel and copper.

11. The leadless plastic chip carrier according to claim 9, wherein said plurality of layers of metal includes layers of nickel and gold, or silver, or nickel and palladium.

* * * * *